United States Patent [19]

Shimizu et al.

[11] Patent Number: 5,919,844
[45] Date of Patent: Jul. 6, 1999

[54] EPOXY RESIN COMPOSITION

[75] Inventors: Ken Shimizu; Atsuto Tokunaga; Masayuki Tanaka, all of Nagoya, Japan

[73] Assignee: Toray Industries, Inc., Japan

[21] Appl. No.: 08/894,751

[22] PCT Filed: Dec. 27, 1996

[86] PCT No.: PCT/JP96/03865

§ 371 Date: Aug. 26, 1997

§ 102(e) Date: Aug. 26, 1997

[87] PCT Pub. No.: WO97/24402

PCT Pub. Date: Jul. 10, 1997

[30] Foreign Application Priority Data

Dec. 28, 1995 [JP] Japan ..................................... 7-343947

[51] Int. Cl.⁶ ................ C08K 5/00; C08L 63/02
[52] U.S. Cl. ........................................... 523/457; 523/451
[58] Field of Search ...................................... 523/451, 457

[56] References Cited

U.S. PATENT DOCUMENTS 5,346,743  9/1994  Uchida et al. ............................. 428/76

FOREIGN PATENT DOCUMENTS 04119656  4/1992  Japan .

*Primary Examiner*—Robert Dawson
*Assistant Examiner*—D. Aylward
*Attorney, Agent, or Firm*—Austin R. Miller

[57] ABSTRACT

Disclosed is an epoxy resin composition suitable for sealing a semiconductor, comprising an epoxy resin (A), a hardener (B), an inorganic filler (C), and a phosphoric acid ester compound (D), an amount of the inorganic filler (C) contained being more than 80% by weight relative to the composition. A semiconductor sealing epoxy resin composition excellent in flame retardancy, formability, reliability and solder heat resistance is obtained without an essential need to use a halogen-based flame retardant or an antimony-based flame retardant.

15 Claims, No Drawings

EPOXY RESIN COMPOSITION

TECHNICAL FIELD

The present invention relates to an epoxy resin composition excellent in flame retardancy, high-temperature reliability and solder heat resistance and, more particularly, to a semiconductor sealing epoxy resin composition and a semiconductor device.

BACKGROUND ART

As for a method for sealing electronic circuit portions, such as semiconductor devices, a sealing method using a sealing resin containing an epoxy rein, a hardening agent and an inorganic filler is mainly employed, in view of cost effectiveness, productivity, and balance in properties. Due to the recent trend toward less thickness and higher packaging density of semiconductor devices, there are increasing demands for high solder heat resistance, high-temperature reliability, humidity resistance reliability and the like of semiconductors. Correspondingly, requirements for sealing resins have been escalating.

For safety ensurance, the UL standards impose a requirement that electronic component parts, such as semiconductor devices, be provided with flame retardancy. Accordingly, conventional sealing resins contain, as a flame retarding agent, halide-based flame retardant agents such as a brominated epoxy resin and, as a flame retarding assistant, antimony compounds such as antimony trioxide.

With recently growing concerns about environmental issues, problems or challenges have been pointed out in respect to various compounds used as flame retarding agents in semiconductor sealing resins.

There is a problem in that when a semiconductor device sealed by an epoxy rein composition containing a halide flame retardant agent is placed in a high temperature environment, the reliability of the semiconductor decreases.

Furthermore, concerns have risen over troublesome processes required for resin wastes if antimony compounds are contained in the such resins.

There have been demands for further improvements in the solder heat resistance and high-temperature reliability of semiconductor devices and the package filling characteristics for the sealing of semiconductors.

It is an object of the present invention to provide an epoxy rein composition excellent in flame retardancy, high-temperature reliability, solder heat resistance and formability represented by package filling characteristics without essentially requiring a halide-based flame retarding agent or an antimony compound, which are conventional flame retarding agents, and to provide an epoxy resin composition that improves the humidity resistance reliability if that property is required.

DISCLOSURE OF THE INVENTION

Accordingly, the present invention is:

(1) an epoxy resin composition comprising an epoxy resin (A), a hardener (B), an inorganic filler (C), and a phosphoric acid ester compound (D), an amount of the inorganic filler (C) contained being 80% by weight relative to the composition, and more particularly, (2) an epoxy resin composition according to (1), wherein a proportion of the epoxy rein (A) in the epoxy resin composition is 0.05–15% by weight, and a proportion of the hardener (B) is such that a chemical equivalent ratio of the hardening functional group of the component (B) to the epoxy groups of the component (A) is 0.5–1.5, and a proportion of the phosphoric acid ester compound (D) is such that the phosphorous atoms of the phosphoric acid ester compound (D) is 0.01–10% by weight relative to the components excluding the inorganic filler, (3) an epoxy resin composition according to (1) or (2), wherein a phosphorous atom of the phosphoric acid ester compound has a valency of five, (4) an epoxy resin composition as described in any one of (1)–(3), wherein the phosphoric acid ester compound has an aromatic group, (5) an epoxy resin composition as described in any one of (1)–(4), wherein the phosphoric acid ester compound (D) has in its molecule a structure of the following chemical formula (I):

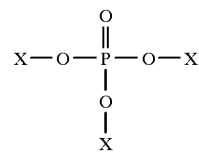

(in the fomula, X represents at least one aromatic group, and may be the same or different)

(6) an epoxy resin composition as described in any one of (1)–(5), wherein the epoxy resin composition contains an ion capturing agent, (7) an epoxy resin composition as described in (6), wherein the ion capturing agent is a hydrotalcite-based compound, (8) an epoxy resin composition as described in any one of (1)–(7), wherein the epoxy resin (A) comprises as an essential element a biphenyl type epoxy component having a structure of the following chemical formula (II):

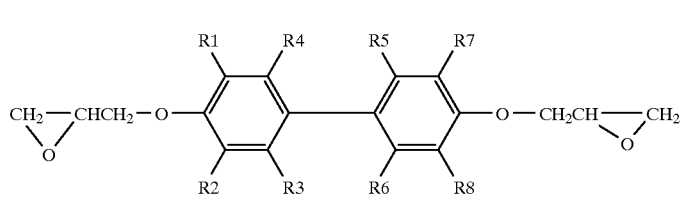

(where R1–R8 in the formula represent hydrogen atoms, alkyl groups having a carbon number of 1–4, or halogen atoms), (9) an epoxy resin composition as described in any one of (1)–(8), wherein the hardener comprises as an essential component a phenol compound (VI) represented by the following formula:

$$Y-CH_2-X-CH_2{-}(Y-CH_2-X-CH_2)_m Y$$

(wherein m is an integer equal to or greater than 0, X is a bivalent aromatic group and may be the same or different, and Y is a univalent or bivalent aromatic group and may be the same or different),

(10) an epoxy resin composition as described in any one of (1)–(9), wherein at least 50% by weight of the phosphoric acid ester compound has a molecular weight of 300 or greater,

(11) an epoxy resin composition as described in any one of (1)–(10), characterized in that an amount of the inorganic filler (C) is 85–98% by weight relative to the resin composition,

(12) an epoxy resin composition as described in any one of (1)–(11), wherein an oxygen index of the composition after being hardened is equal to or higher than 42%,

(13) an epoxy resin composition as described in any one of (1)–(12), wherein the epoxy resin composition is applicable to semiconductor sealing, and

(14) a semiconductor device wherein a semiconductor element is sealed by an epoxy resin composition as described in (13).

Further, the method of the invention is:

(15) a method for producing an epoxy resin composition characterized by melting and mixing an epoxy resin (A), a hardener (B), an inorganic filler (C), and a phosphoric acid ester compound (D) (wherein an amount of the inorganic filler (C) compounded is at least 80% by weight relative to the composition),

(16) a method for producing a semiconductor sealing epoxy resin composition characterized by melting and mixing an epoxy resin (A), a hardener (B), an inorganic filler (C), a phosphoric acid ester compound (D) and an ion capturing agent (wherein an amount of the inorganic filler (C) compounded is at least 80% by weight relative to the composition), and

(17) a method for producing a semiconductor sealing epoxy resin composition as described in (16), wherein the ion capturing agent is a hydrotalcite-based compound.

In the composition of the present invention, by compounding at least 80 wt. % inorganic filler (C) and compounding a phosphoric acid ester, a flame retardancy is provided and, further, formability represented by filling characteristics is improved. Furthermore, if a semiconductor device is formed by sealing a semiconductor element with the composition of the present invention, an excellent humidity resistance reliability and an excellent solder heat resistance are achieved. Further, by compounding a hydrotalcite-based compound, the humidity resistance reliability is improved.

BEST MODES FOR CARRYING OUT THE INVENTION

The present invention will be described in detail below.

The epoxy resin (A) in the present invention is not particularly limited as long as it has a plurality of epoxy groups in its molecule. Specific examples of the epoxy resin (A) are, for example, cresol novolac type epoxy resin, phenol novolac type epoxy resin, biphenyl type epoxy resin, bisphenol A type epoxy resin, bisphenol F type epoxy resin, linear aliphatic epoxy resin, alicyclic epoxy resin, heterocyclic epoxy resin, spiro ring-containing epoxy resin, halogenated epoxy resin, and the like.

Among these epoxy resins (A), an epoxy resin particularly preferable for use in the present invention, in view of excellence in solder heat resistance, is one that contains as an essential component a biphenyl type epoxy resin having a skeleton represented by the following general formula (II):

(wherein R1–R8 in the formula represent the same or different ones of hydrogen atoms, alkyl groups having a carbon number of 1–4, and halogen atoms).

The epoxy resin (A) preferably contains a biphenyl type epoxy rein having a skeleton represented by the foregoing chemical formula (I) in an amount of 50% by weight or more, and, more preferably, 70% by weight or more.

Preferable examples of the epoxy resin skeleton represented by the foregoing formula (I) are:

4,4'-bis(2,3-epoxy-propoxy)biphenyl;
4,4'-bis(2,3-epoxy-propoxy)-3,3',5,5'tetramethylbiphenyl;
4,4'-bis(2,3-epoxy-propoxy)-3,3',5,5'-tetramethyl-2-chlorobiphenyl;
4,4'-bis (2,3-epoxy-propoxy)-3,3',5,5'-tetramethyl-2-bromobiphenyl;
4,4'-bis (2,3-epoxy-propoxy)-3,3',5,5'-tetraethylbiphenyl;
4,4'-bis (2,3-epoxy-propoxy)-3,3',5,5'-tetrabutylbiphenyl;
4,4'-bis (2,3-epoxy-propoxy)biphenyl;
4,4'-bis (2,3-epoxy-propoxy)-3,3',5,5'-tetramethylbiphenyl; and the like. Any of these may be used alone or in a mixed system, achieving sufficient advantages. The aforementioned epoxy resin includes, within its scope, polymers formed by opening the rings of epoxy groups.

In the present invention, the amount of the epoxy resin (A) compounded is normally 0.05–15% by weight, more preferably, 2–15% by weight, further more preferably 2–9% by weight, in the epoxy resin compound, in view of formability and adhesion property. If the amount is too small, the formability or adhesion property becomes insufficient. If the amount is too large, the coefficient of linear expansion of the hardened material becomes large, with a tendency that reduction of stress in the hardened material will become difficult.

The hardener (B) in the present invention is not particularly limited as long as it reacts with the epoxy resin (A) for hardening. Normally, compounds having phenolic hydroxyl groups, compound having acid anhydrides, or amines may preferably be used. Examples of such a compound, that is, a compound having two or more phenolic hydroxyl groups in its molecule, are, for example, phenol novolac resin, cresol novolac resin, phenol-p-xylylene copolymer (generally termed phenol aralkyl resin) represented by formula (VI) below, various novolac resins synthesized from bisphenol A, resorcin or the like, various polyhydric phenols such as tris(hydroxyphenyl)methane, dihydrobiphenyl and the like, polyvinyl phenol and

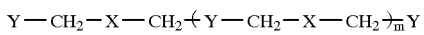

(VI)

(wherein m is an integer equal to or greater than 0, X is a bivalent aromatic group and may be the same or different, and Y is a univalent or bivalent aromatic group and may be the same or different).

Examples of the compound having an acid anhydride are maleic anhydride, phthalic anhydride, pyromellitic anhydride, and the like. Examples of the amines include, but are not limited to, aromatic amines, such as metaphenylenediamine, di(aminophenyl)methane (generally termed diaminodiphenyl methane), diaminodiphenyl sulfone and the like. For semiconductor sealing, phenyl-based hardeners may preferably be used in view of heat resistance, humidity resistance and storability. In some applications, two or more kinds of hardeners may be used together.

The phenol-based hardener preferably contains a phenol aralkyl resin having a structure represented by formula (III) below in view of an excellent solder heat resistance and a low water absorption of a resulting semiconductor device. The amount thereof compounded is preferably at least 50% of the hardener:

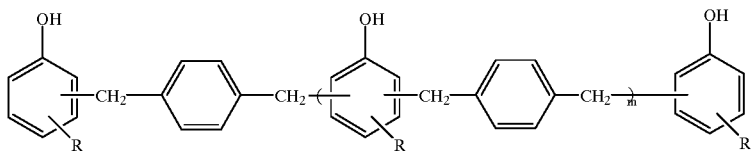

(wherein R represents a hydrogen atom or an organic group and may be the same or different, R preferably being a hydrogen atom or a methyl group, and m is an integer equal to or greater than 0).

It is preferable that a structure represented by the foregoing formula wherein m is equal to or less than 3 be contained in an amount of 90% by weight or less.

The amount of the hardener (B) compounded in the present invention is normally 0.5–20% by weight, preferably 1–10% by weight, more preferably 1–9% by weight, relative to the entire resin composition. Preferably, the compound ratio between the hardener (B) and the epoxy resin (A) is such that the chemical equivalent amount ratio of the hardening functional groups of (B) to the epoxy groups of (A) is within a range of 0.5–1.5, preferably 0.8–1.2, in view of mechanical characteristics and humidity resistance reliability.

In the present invention, it is possible to use a hardening catalyst in order to accelerate the hardening reaction between the epoxy resin (A) and the hardener (B). The hardening catalyst is not particularly limited as long as it accelerates the hardening reaction. Examples of the hardening catalyst are imidazol compounds such as 2-methylimidazol 2,4-dimethylimidazol, 2-etyl-4-methylimidazol, 2-phenylimidazol, 2-phenyl-4-methylimidazol, 2-heptadecylimidazol and the like, tertiary amine compounds such as triethylamine, benzyldimethylamine, α-mehtylbenzyldimethylamine, 2-(dimethylaminomethyl)phenol, 2,4,6-tris (dimethylaminomethyl)phenol, 1,8-diaza-bicyclo(5,4,0)un deccen-7 and the like, organic metal compounds such as zirconium tetramethoxide, zirconium tetrapropoxide, tetrakis(acetylaceto) zirconium, tri(acetylaceto)aluminum and the like, organic phosphine compounds such as triphenyl phosphine, trimethyl phosphine, triethyl phosphine, tributyl phosphine, tri(p-methylphenyl)phosphine, tri(nonylphenyl) phosphine and the like. Among these, organic phosphine compounds are preferably used in view of humidity resistance. These hardening catalysts may be used in combination of two or more kinds depending on applications. The amount thereof added is preferably within a range of 0.1–10 parts by weight relative to 100 parts by weight of the epoxy resin (A).

Examples of the inorganic filler (C) are amorphous silica, crystalline silica, calcium carbonate, magnesium carbonate, alumina, magnesia, clay, talc, calcium silicate, titanium oxide, asbestos, glass fiber and the like. Among these, amorphous silica is preferably used since it has a great effect on reduction of the coefficient of linear expansion and is effective to reduce stress. Amorphous silica may be produced in any desired method, for example, a method wherein crystalline silica is melted, a method wherein amorphous silica is synthesized from various materials, and the like.

The configuration and particle diameter of the amorphous silica in the present invention are not particularly limited. However, in view of fluidity, it is preferable that the amorphous silica have spherical particles of an average particle diameter equal to or greater than 3 μm but less than or equal to 40 μm, and be used in the inorganic filler in an amount of 60% by weight or more. More preferably, the amount of amorphous silica in the inorganic filler is 90% by weight or more.

The average particle diameter herein means a particle diameter (median diameter) with an accumulated weight of 50%. In the present invention, the proportion of the inorganic filler (C) is preferably 80–98% by weight and, more preferably, 85–98% by weight relative to the entire resin composition, in view of flame retardancy, formability and low stress.

The phosphoric acid ester compound, that is, the component (D) in the present invention, refers to compounds having bonds of "P—O—R" (R being an organic group) as chemical structures. Normally, phosphoric acid ester compounds wherein the phosphorus atoms have a valency of three or five are used. As for phosphoric acid ester compounds having trivalent phosphorus atoms, there are phosphite compounds, phosphonite compounds, and phosphinite compounds. As for phosphoric acid ester compounds having pentavalent phosphorus atoms, there are phosphate compounds, phosphonate compounds, and phosphinate compounds. Among these, phosphoric acid ester having pentavalent phosphorus atoms are preferably used in view of storage stability and flame retardancy.

Among these phosphoric acid ester compounds, compounds having aromatic groups as organic groups forming esters are preferred in view of flame retardancy, humidity resistance reliability and solder heat resistance.

Examples of such phosphoric acid ester compounds are triphenyl phosphate, resorcinol bis(diphenol) phosphate, 2-ethylhexyldiphenyl phosphate, and other compounds described later.

Further, it is preferable that a skeleton represented by formula (I) below is contained in the molecule:

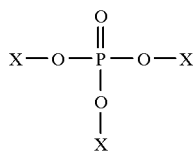
(I)

(wherein X represents an aromatic group having a valency of one or greater, and may be the same or different).

More specifically, compounds represented by formulas (IV) and (V) are indicated:

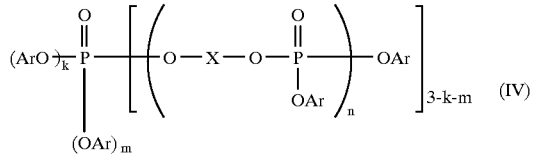
(IV)

Wherein X:

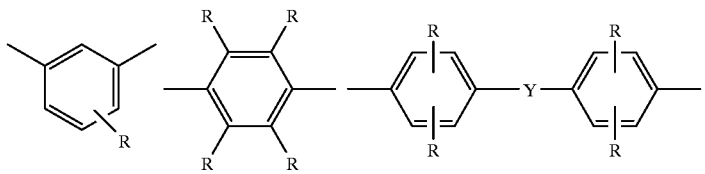

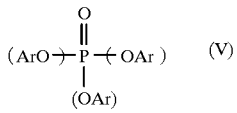
(V)

wherein
(wherein R represents the same or different ones of a hydrogen atom or an alkyl group having a carbon number of 1–5; Ar represents the same or different aromatic groups, Y represents a direct bond, an alkylene group; a phenylene group, —S—, —SO$_2$— or —CO—; Ar represents the same or different phenyl groups or phenyl groups substituted with an organic group; k and m are integers equal to or greater than 0 but less than or equal to 2, and k+m is an integer equal to or greater than 0 but less than or equal to 2; n is an integer equal to or greater than 0). Among such compounds, compounds having the structure of IV are preferably used.

The phosphoric acid ester compound in the present invention may also be a mixture of compounds having different chemical structures or a mixture of compounds having different molecular weights. As for the amount of the phosphoric acid ester compound added, the lower limit amount of the phosphorus atoms of the phosphoric acid ester compound is preferably 0.01% by weight, more preferably 0.1% by weight, and the upper limit amount thereof is preferably 10% by weight, more preferably 5% by weight, relative to the amount of components of the epoxy resin composition excluding the inorganic filler, in view of flame retardancy, solder heat resistance and humidity resistance reliability.

It is preferred that phosphoric acid ester compound having molecular weights of 300 or greater, preferably 500 or greater, be contained in the phosphoric acid ester in an amount of 50% by weight or more, in view of humidity resistance and solder heat resistance. In the composition of the present invention, it is also possible to compound a phosphoric acid ester having trivalent phosphorus atoms and form a phosphoric acid ester having pentavalent phosphorus atoms through oxidation in the composition, achieving substantially the same advantages. The phosphoric acid ester compound may also be a compound obtained by hydrolyzing ester linkages and binding other phosphorus atoms thereto so as to provide P—O—P linkages, that is, a condensate.

If a further enhanced humidity stability is required for a semiconductor device, it is preferable to compound an ion capturing agent into the resin composition of the present invention. The ion capturing agent is an agent having a function of capturing an ion. Examples of such an agent are ion exchangers, and hydrotalcite-based compounds.

The ion exchanger means a substance having a function of ion exchange, for example, a substance having a function wherein in contact with a solution having ions, ions leave the substance into the solution while ions are taken up into the substance from the solution.

The hydrotalcite-based compound refers generally to non-stoichiometric complex metal compounds represented by formula (VII) below, and compounds obtained by firing the former compounds so that water and $A^{n-}$ groups are partially or completely removed.

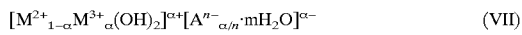

$$[M^{2+}{}_{1-\alpha}M^{3+}{}_{\alpha}(OH)_2]^{\alpha+}[A^{n-}{}_{\alpha/n}\cdot mH_2O]^{\alpha-} \qquad (VII)$$

In the formula, $M^{2+}$ means a bivalent positive ion of metal, for examples, bivalent positive ions of magnesium, manganese, iron, cobalt, nickel, and copper.

$M^{3+}0$ means a trivalent positive ion of metal, for example, trivalent positive ions of aluminum, iron, chrome, cobalt and indium.

$A^{n-}$ means a negative ion having a valency of n, for example, $OH^-$, $Br^-$, $F^-$, $Cl^-$, $NO3^-$, $CO_3{}^{2-}$, $SO_4{}^-$, $Fe(CN)_6{}^{3-}$, $CHCOO^-$, $C_6H_4(OH)COO^-$, tartaric acid ion, oxalic acid ion, salicylic acid ion, and the like.

$\alpha$ is normally greater than 0 but less than or equal to 0.33 in order to provide a structure having an ion capturing characteristic, and m represents a number equal or greater than 0.

Normally, magnesium ion may be used as $M^{2+}$, and aluminum ion may be used as $M^{3+}$, and $CO_3{}^{2-}$ may be used as $A^{n-}$.

Preferred specific examples of the hydrotalcite-based compounds represented by (VII) are $Mg_{4.5}Al_2(OH)_{13}CO_3 \cdot 3.5H_2O$, $Mg_{4.5}Al_2(OH)_{13}CO_3$, $Mg_5Al_{1.5}(OH)_{16}CO_3 \cdot 4H_2O$, $Mg_6Al_2(OH)_{16}CO_3$, and the like. Preferred specific examples of compounds obtained by removing water and negative ions from the compounds represented by formula (VII) are $Mg_{0.65}Al_{0.35}O_{1.175}$, $Mg_{0.7}Al_{0.3}O_{1.15}$, $Mg_{0.75}Al_{0.3}O_{1.125}$, $Mg_{0.8}Al_{0.3}O_{1.1}$, and the like. Hydrotalcite-based compounds from which water and negative ions have been removed may be obtained by firing hydrotalcite-based compound represented by (VII) at 400–900° C. and, preferably, 500–700° C.

If a hydrotalcite-based compound is compounded in the present invention, the amount thereof added is 0.01–5% by weight, preferably 0.02–3% by weight, more preferably 0.03–1% by weight. If the amount is too small, no effect is obtained by the addition. If it is too large, the solder heat resistance tends to decrease.

It is preferable that silane coupling agent be compounded into the epoxy resin composition of the present invention. As a silane coupling agent, compounds wherein silicon atoms directly are bonded with a an organic group such as hydrolytic group amino groups, halogen atoms, alkoxy groups and the like, and partial hydrolytic condensates thereof are normally used. As a hydrolytic group, an alkoxy group, in particular, methoxy group and ethoxy group, may preferably be used. As an organic group, hydrocarbon groups or hydrocarbon groups substituted by nitrogen atoms, oxygen atoms, halogen atoms, sulfur atoms and the like, may be used. Silane coupling agents having organic groups having amino groups, and silane coupling agents having organic groups having epoxy groups are preferably used. Further, silane coupling agents having secondary amino groups are preferred.

It is also possible to add to the epoxy resin composition of the present invention substances other than described above, for example, colorants such as carbon black, iron oxide and the like, elastomers such as silicone rubber, olefin-based copolymers, modified nitrile rubber, modified polybutadiene rubber, modified silicone oil and the like, thermoplastic resins such as polyethylene and the like, long-chain fatty acid, metal salts of long-chain fatty acids, esters of long-chain fatty acids, amides of long-chain fatty acids, mold release agents such as paraffin wax and the like, cross linking agents such as organic peroxides, as desired.

In the present invention, it is also possible to compound flame retardant agents such as halogen compounds including halogenated epoxy resin, and various flame retarding assistants such as antimony trioxide. However, since these substances have a tendency to reduce the reliability of a semiconductor device, it is preferred that the amounts of halogen atoms and antimony atoms in the resin composition be, respectively, 0.2% by weight or less, further, 0.1% by weight or less, still further, 0.01% by weight or less. It is further preferred that substantially no halogen atoms and substantially no antimony atoms be compounded.

Furthermore, in the epoxy resin composition of the present invention, it is preferred that the oxygen index after the hardening of the epoxy resin be 42% or higher, in view of flame retardancy, high-temperature reliability and formability.

In the epoxy resin composition of the present invention, it is preferred that after the aforementioned materials are mixed, the mixture be melted and kneaded. The epoxy resin composition may be produced by melting and kneading by using a known kneading method, for example, a Banbury mixer, a kneader, a roll, a single or double-screw extruder, a co-kneader, and the like. The melting temperature is preferably within a range of 60–130° C. Further, by sealing a semiconductor with the epoxy resin composition of the present invention, a semiconductor device is formed.

The semiconductor device herein refers to electronic circuits (integrated circuits) produced by integrating and wiring semiconductor elements, such as transistors, diodes, resistors, capacitors and the like, on substrates and, more widely, to electronic parts sealed by the epoxy resin composition of the present invention.

EXAMPLES

The present invention will be described specifically with reference to Examples. In Examples, % is based on weight.

EXAMPLES, COMPARATIVE EXAMPLES

Components shown in Table 1 were dry-blended by a mixer at composition percentages shown in Table 2. After the mixtures were heated and kneaded for five minutes by a mixing roll at a roll surface temperature of 90° C., the mixtures were cooled and ground to produce semiconductor sealing epoxy resins composition.

Using the resin compositions, moldings were formed by a low-pressure transfer molding method in conditions of 175° C. and 2 minutes for cure time. After post-cure was performed at 180° C. for 5 hours, properties of the resin compositions were evaluated by the following property measurement methods.

Solder Heat Resistance: Twenty 160-pin QFPs (quad flat packages) having a chip size of 12×12 mm carrying dummy semiconductors with vapor-deposited Al wirings were formed. After being subjected to moistening at 85° C./85%RT for a predetermined length of time, the QFPs were heated in an IR re-flow furnace at a maximum temperature of 245° C. The number of external crack incidents were determined.

Water Absorption: After the same 160-pin QFPs as used in the solder heat resistance test were subjected to moistening at 85° C./85%RT, the water absorption of the resin compositions were measured.

High-Temperature Reliability: Using 16-pin DIPs (dual in-line packages) carrying dummy semiconductors thereon, high-temperature reliability at 200° C. was evaluated. The length of time before the accumulated failure rate became 63% was determined as high-temperature property life time.

Flame Retardancy Test: Flame test pieces of 5"×½"×1/16" were molded and post-cured. Flame retardancy thereof was evaluated in accordance with the UL94 standards.

Oxygen Index: Test pieces of 5"×½"×⅛" were molded and post-cured. In accordance with JIS K7201, the volume concentrations of gasses at limits of flammability were determined.

Oxygen index (%)=[oxygen]/([oxygen]+[nitrogen])

PKG Filling Characteristics (Package Filling Characteristics): After 160-pin QFPs for use in the solder heat resistance test were formed, the QFPs were observed visually and microscopically to check presence/absence of unfilling or void.

Results are shown in Table 3.

TABLE 1

| Name | Description | Amount added (part(s) by weight) |
|---|---|---|
| Epoxy resin | | |
| I | Ortho-cresol novolac resin of an epoxy equivalent amount of 200 | * |
| II | 4,4'-bis(2,3-epoxy-propoxy)-3,3',5,5'-tetramethylbiphenyl | * |

TABLE 1-continued

| Name | Description | Amount added (part(s) by weight) |
|---|---|---|
| Hardener | | |
| I | Phenol novolac resin of a hydroxyl group equivalent amount of 107 | * |
| II | Phenol compound represented by formula E below | * |
| Inorganic filler | Amorphous silica having an average particle diameter of 10 µm | * |
| Frame retardant | | |
| I | Phosphoric acid ester compound represented by formula A below | * |
| II | Phosphoric acid ester compound represented by formula B below | * |
| III | Phosphoric acid ester compound represented by formula C below | * |
| IV | Phosphoric acid ester compound represented by formula D below | * |
| V | Triphenyl phosphate | * |
| VI | Bisphenol A type resin of an epoxy equivalent amount of 400, having a bromine content of 50% by weight | * |
| Flame retarding assistant | Antimony trioxide | * |
| Hardening accelerator | Triphenylphosphine | 0.1 |
| Silane coupling agent | N-phenylaminopropyltrimethoxysilane | 1.0 |
| Colorant | Carbon black | 0.2 |
| Mold release agent | Carnauba wax | 0.3 |
| Hydrotalcite compound | DHT4H by Kyowa Kagaku Kogyo | * |

*Amounts added are indicated in Table 2.

(A)

n = 1.2

(B)

n = 1.1

-continued

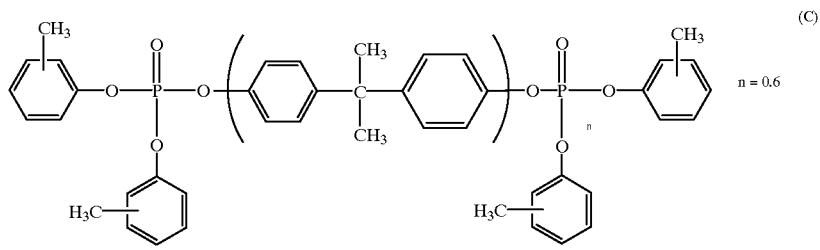

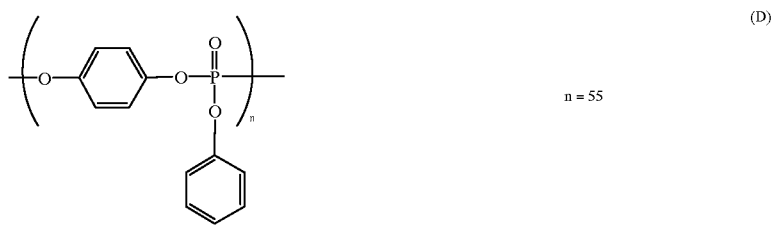

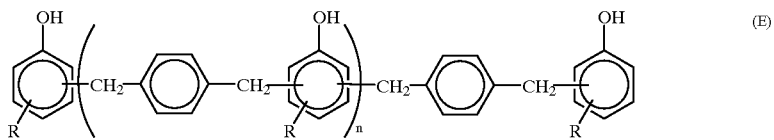

TABLE 2

| | Amount of epoxy resin added (part(s) by weight) | | Amount of hardener added (part(s) by weight) | | Amount of filler added (part(s) by weight) | Flame retardant | | Amount of flame retarding assistant added (part(s) by weight) | Hydrotal cite-base compound (part(s) by weight) |
|---|---|---|---|---|---|---|---|---|---|
| | I | II | I | II | | Type | Amount added (part(s) by weight) | | |
| Example 1 | 0.0 | 7.9 | 0.0 | 7.0 | 80.0 | I | 3.5 | 0 | 0 |
| Example 2 | 0.0 | 6.0 | 0.0 | 4.9 | 85.0 | I | 2.5 | 0 | 0 |
| Example 3 | 2.6 | 2.6 | 0.0 | 4.7 | 87.0 | I | 1.5 | 0 | 0 |
| Example 4 | 0.0 | 6.1 | 1.9 | 1.9 | 87.0 | I | 1.5 | 0 | 0 |
| Example 5 | 0.0 | 5.5 | 0.0 | 4.4 | 87.0 | I | 1.5 | 0 | 0 |
| Example 6 | 0.0 | 5.0 | 0.0 | 4.0 | 89.0 | I | 0.4 | 0 | 0 |
| Example 7 | 0.0 | 5.5 | 0.0 | 4.4 | 87.0 | I | 1.5 | 0 | 0 |
| Example 8 | 0.0 | 5.5 | 0.0 | 4.4 | 87.0 | II | 1.5 | 0 | 0 |
| Example 9 | 0.0 | 5.5 | 0.0 | 4.4 | 87.0 | III | 1.5 | 0 | 0 |
| Example 10 | 0.0 | 5.5 | 0.0 | 4.4 | 87.0 | IV | 1.5 | 0 | 0 |
| Example 11 | 0.0 | 5.5 | 0.0 | 4.4 | 87.0 | I | 1.5 | 0 | 0.1 |
| Example 12 | 0.0 | 4.3 | 0.0 | 3.9 | 90.0 | I | 0.3 | 0 | 0 |
| Example 13 | 0.0 | 5.5 | 0.0 | 4.4 | 87.0 | V | 1.5 | 0 | 0 |
| Comparative Example 1 | 0.0 | 9.0 | 0.0 | 7.9 | 78.0 | I | 3.5 | 0 | 0 |
| Comparative Example 2 | 0.0 | 6.3 | 0.0 | 5.1 | 87.0 | — | — | 0 | 0 |
| Comparative Example 3 | 0.0 | 6.8 | 0.0 | 5.6 | 85.0 | VI | 0.5 | 0.5 | 0 |
| Comparative Example 4 | 0.0 | 6.3 | 0.0 | 5.1 | 87.0 | — | — | 0 | 0.1 |

TABLE 3

| | Oxygen index (%) | Flame retardancy (UL94) | High-temperature reliability (h) | PKG filling characteristics | Solder heat resistance | Water absorption (%) |
|---|---|---|---|---|---|---|
| Example 1 | 45 | V-0 | 400 | good | 0/20 | 0.28 |
| Example 2 | 44 | V-0 | 500 | good | 0/20 | 0.21 |
| Example 3 | 47 | V-0 | >500 | good | 0/20 | 0.19 |
| Example 4 | 48 | V-0 | >500 | good | 0/20 | 0.19 |

TABLE 3-continued

| | Oxygen index (%) | Flame retardancy (UL94) | High-temperature reliability (h) | PKG filling characteristics | Solder heat resistance | Water absorption (%) |
|---|---|---|---|---|---|---|
| Example 5 | 50 | V-0 | >500 | good | 0/20 | 0.15 |
| Example 6 | 52 | V-0 | >500 | good | 0/20 | 0.13 |
| Example 7 | 50 | V-0 | >500 | good | 0/20 | 0.15 |
| Example 8 | 50 | V-0 | >500 | good | 0/20 | 0.15 |
| Example 9 | 50 | V-0 | >500 | good | 0/20 | 0.15 |
| Example 10 | 49 | V-0 | >500 | good | 0/20 | 0.17 |
| Example 11 | 50 | V-0 | >500 | good | 0/20 | 0.16 |
| Example 12 | 55 | V-0 | >500 | good | 0/20 | 0.12 |
| Example 13 | 50 | V-0 | 400 | good | 5/20 | 0.16 |
| Comparative Example 1 | 41 | V-1 | 200 | good | 10/20 | 0.31 |
| Comparative Example 2 | 40 | V-out | 400 | Void | 0/20 | 0.13 |
| Comparative Example 3 | 49 | V-0 | 130 | Void | 2/20 | 0.25 |
| Comparative Example 4 | 39 | V-out | 400 | Void | 0/20 | 0.13 |

As shown in Table 3, epoxy resin compositions according to the present invention were excellent in flame retardancy, solder heat resistance, high-temperature reliability and package filling characteristics.

A few of the aforementioned compositions were selected and subjected to humidity resistance reliability test (PCBT property life time measurement). In the measurement method, 16-pin DIPs (dual in-line packages) were used for evaluation of disconnections under conditions of 140° C., 85%RT and DC20V applied. The length of time before the accumulated failure (disconnection) rate became 63% was determined.

Results are shown in Table 4.

TABLE 4

| | PCBT characteristic life time (h) |
|---|---|
| Example 5 | 80 |
| Example 11 | 250 |
| Comparative Example 2 | 100 |
| Comparative Example 4 | 250 |

Table 4 shows that compounding the hydrotalcite-based compound achieved a greater improvement in the humidity resistance reliability in the compositions containing phosphoric acid ester compound than in the compositions containing no phosphoric acid ester compound.

INDUSTRIAL APPLICABILITY

A semiconductor sealing epoxy resin composition excellent in flame retardancy, formability, reliability and solder heat resistance is obtained without an essential need to use a halogen-based flame retarding agent or an antimony-based flame retarding agent. It becomes possible to improve the performance of semiconductors obtained as a result of use of the epoxy resin composition.

We claim:

1. An epoxy resin composition comprising an epoxy resin (A), a hardener (B), an inorganic filler (C), and a phosphoric acid ester compound (D), an amount of the inorganic filler (C) contained being greater than 80% by weight relative to the composition.

2. An epoxy resin composition according to claim 1, wherein a proportion of the epoxy rein (A) in the epoxy resin composition is 0.05–15% by weight, and a proportion of the hardener (B) is such that a chemical equivalent ratio of the hardening functional group of the component (B) to the epoxy groups of the component (A) is 0.5–1.5, and a proportion of the phosphoric acid ester compound (D) is such that the phosphorous atoms of the phosphoric acid ester compound (D) is 0.01–10% by weight relative to the components excluding the inorganic filler.

3. An epoxy resin composition according to claim 1 or 2, wherein a phosphorous atom of the phosphoric acid ester compound has a valency of five.

4. An epoxy resin composition according to any one of claims 1–3, wherein the phosphoric acid ester compound has an aromatic group.

5. An epoxy resin composition according to claim 1, wherein the phosphoric acid ester compound (D) has in its molecule a structure of the following chemical formula (I):

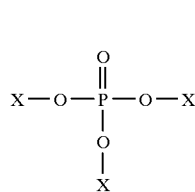

(I)

wherein X represents at least one aromatic group, and may be the same or different.

6. An epoxy resin composition according to claim 1, wherein the epoxy resin composition further comprises an ion capturing agent.

7. An epoxy resin composition according to claim 6, wherein the ion capturing agent is a hydrotalcite-based compound.

8. An epoxy resin composition according to claim 1, wherein at least 50% by weight of the phosphoric acid ester compound has a molecular weight of 300 or greater.

9. An epoxy resin composition according to claim 1 wherein the amount of the inorganic filler (C) is 85–98% by weight relative to the resin composition.

10. An epoxy resin composition according to claim 1, wherein the composition after being hardened has an oxygen index equal to or higher than 42%.

11. An epoxy resin composition according to claim 1, wherein the epoxy resin composition is applicable to semiconductor sealing.

12. A semiconductor device wherein a semiconductor element is sealed by an epoxy resin composition defined in claim 11.

13. A method for producing an epoxy resin composition characterized by melting and mixing an epoxy resin (A), a hardener (B), an inorganic filler (C), and a phosphoric acid ester compound (D) (wherein an amount of the inorganic filler (C) compounded is at least 80% by weight relative to the composition).

14. A method for producing a semiconductor sealing epoxy resin composition characterized by melting and mixing an epoxy resin (A), a hardener (B), an inorganic filler (C), a phosphoric acid ester compound (D) and an ion capturing agent (wherein an amount of the inorganic filler (C) compounded is at least 80% by weight relative to the composition).

15. A method for producing a semiconductor sealing epoxy resin composition according to claim 14, wherein the ion capturing agent is a hydrotalcite-based compound.

* * * * *

UNITED STATES PATENT AND TRADEMARK OFFICE
CERTIFICATE OF CORRECTION

PATENT NO.  : 5,919,844
DATED       : July 6, 1999
INVENTOR(S) : Shimizu et al

It is certified that error appears in the above-identified patent and that said Letters Patent is hereby corrected as shown below:

In Column 13, after the Formula (E), please insert

--(in Formula (E), R is a methyl group, and n is 0.8)--.

Signed and Sealed this

Twenty-fifth Day of January, 2000

Attest:

Attesting Officer

Acting Commissioner of Patents and Trademarks